United States Patent [19]
Clemens

[11] Patent Number: 5,865,905
[45] Date of Patent: Feb. 2, 1999

[54] ROLLED FILM SOLAR CONCENTRATOR

[75] Inventor: Donald D. Clemens, Thousand Oaks, Calif.

[73] Assignee: Boeing North American, Inc., Seal Beach, Calif.

[21] Appl. No.: 723,703

[22] Filed: Sep. 30, 1996

[51] Int. Cl.⁶ .................................................. H01L 31/045
[52] U.S. Cl. ..................... 136/245; 136/246; 126/624; 126/693; 126/696
[58] Field of Search ..................................... 136/245, 246, 136/248; 126/624, 692–695; 359/869, 847

[56] References Cited

U.S. PATENT DOCUMENTS

| | | | |
|---|---|---|---|
| 4,134,387 | 1/1979 | Tornstrom | 126/684 |
| 4,173,397 | 11/1979 | Simpson | 359/849 |
| 4,282,394 | 8/1981 | Lackey et al. | 136/245 |
| 4,320,246 | 3/1982 | Russell | 136/248 |
| 5,154,777 | 10/1992 | Blackmon et al. | 136/245 |

*Primary Examiner*—Nam Nguyen
*Attorney, Agent, or Firm*—Stephen E. Kahm; Harry B. Field

[57] ABSTRACT

A concentrating solar array consisting of a roll of reflective film which is stretched between tension wires strung between a pair of wire stays. There is a roll of film and a take up roll such that the film can be unrolled from the storage roll and pulled toward the take-up roll to replace degraded film. A pair of extension arms holds a solar cell at a fixed position relative to the solar concentrator film surface to receive concentrated sunlight. The roll of reflective film ensures the life requirements of the solar concentrator can be met in space, by replacing exposed concentrator film as it degrades.

1 Claim, 2 Drawing Sheets

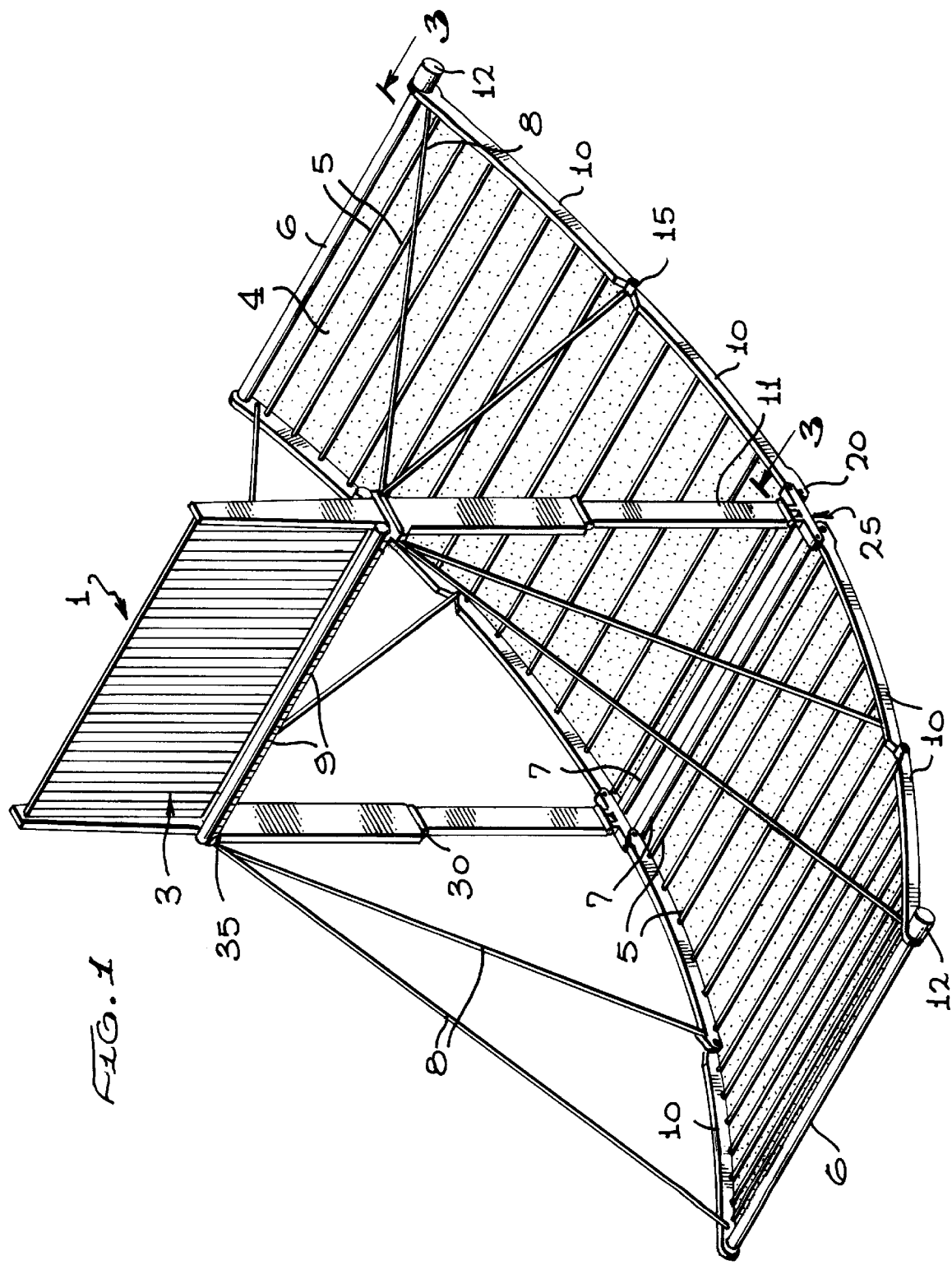

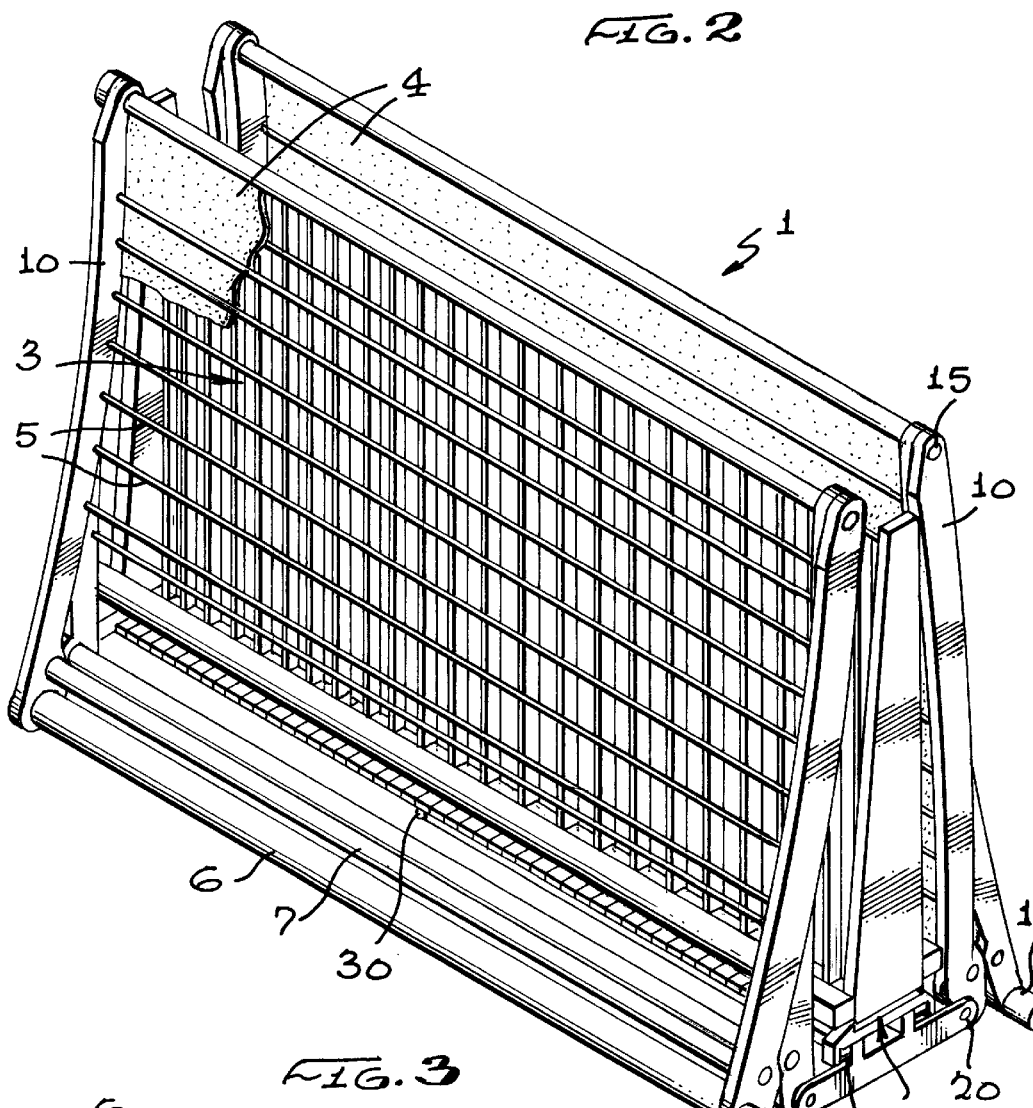
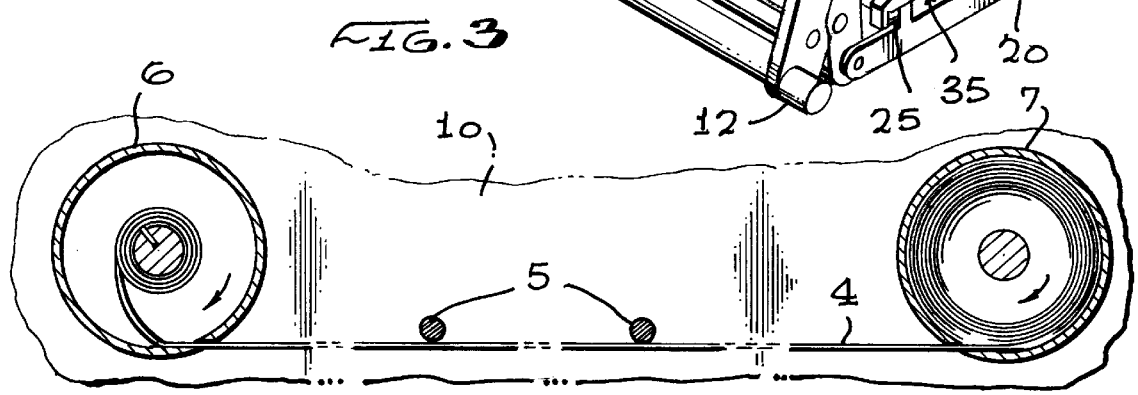

ROLLED FILM SOLAR CONCENTRATOR

BACKGROUND OF THE INVENTION

1. Field of the Invention

This invention relates to solar concentrators, and more particularly to a rolled film solar concentrator.

2. Description of the Related Art

In the past inflatable concentrators have been used; some would have chemicals inside which would harden on the inside surface to ridgidize the inflatable concentrator. Unfortunately the ridgidizing causes the film of the inflatable concentrator to change shape thereby losing its reflectivity and focusing properties.

Contamination in space such as micrometeors, atomic oxygen, and other debris can puncture inflatable concentrators. Some inflatable concentrators have a makeup gas to keep the concentrator fully inflated. However, over long periods of time the amount of gas needed to keep the concentrator inflated becomes prohibitive.

Further the reflective surface of the concentrator degrades over time.

Inflatable concentrators have a short life and questionable optical properties.

SUMMARY OF THE INVENTION

This concentrator uses film stretched across tension wires to give it the proper optical shape. It has feed and take-up rollers located on each of the boundaries on the concentrator. After contamination degrades the film, the rollers wind on a new section, thereby, restoring the optical properties. This overcomes previous problems with surfaces degrading from contamination. Shape is always maintained by tension wires. They are stretched between rigid structures, that form two of the boundaries of the concentrator.

OBJECTS OF THE INVENTION

It is an object of the invention to maintain the reflective properties of a concentrator over long periods of time.

It is a further object of the invention to maintain the shape of the concentrator and thereby its optical properties.

Other objects, advantages and novel features of the present invention will become apparent from the following detailed description of the invention when considered in conjunction with the accompanying drawing.

BRIEF DESCRIPTION OF THE DRAWINGS

FIG. 1 is a perspective view of the concentrating solar array.

FIG. 2 is a perspective view of the concentrating solar array folded prior to deployment.

FIG. 3 is a side view of the rollers on the concentrating solar array.

DETAILED DESCRIPTION OF THE PREFERRED EMBODIMENT

FIG. 1 shows in general a concentrating solar array 1. Solar energy from the sun strikes the concentrator film 4 and is reflected to the solar cells 9, which in turn are cooled by the heat pipe 3. The concentrator film 4 is held in place by tensioned wires 5 that are in turn positioned by the wire stays 10. The wire stays themselves are hinged together at pivots 15 and connected to the extension arms 11. The concentrator film 4 is located on a feed roller 7 and is strung underneath the tensioned wires 5 to the take-up roller 6. When the film is degraded from atomic oxygen or other space contaminations, the take up roller 6 may be rotated by motor 12 pulling fresh uncontaminated film from the film roll 7 over the tensioned wires 5 to the take up roll 6. Control lines 8 position the wire stays 10 and ensure that solar energy is maintained and focused on the solar cells 9.

FIG. 2 shows the concentrating solar array in its folded position before deployment. The wire stays 10 are folded up approximately 180 degrees back on themselves and the rest of the assembly in turn is folded up about 90 degrees up against the extension arm 11 as best seen in FIG. 1. On deployment the extension arms 11 extend in length moving the solar cells 9 and heat pipe to a fixed distance from the concentrator film 4. The extension arms 11 have three pivots on them. Pivot 35 is up near the solar cells 9, pivot 30 is in the center of the extension arm 11 and pivot 25 is down at the base of the extension arm 11 near the locations where the wire stays 10 are attached. Before deployment the extension arms 11 each fold up 90 degrees and bring the feed rollers 7 up in close proximity to the solar cells 9. On deployment the wire stays 10 which are pivoted at pivots 15 and 20 unfold to stretch the concentrator film 4 into position to reflect sunlight onto solar cells 9. When stored, the concentrator film 4 is already taken up from the feed rollers 7 to the take-up roller 6 and is strung over the tension wires 5. After the wire stays 10 are extended, the take-up roller 6 is activated by motor 12 to put a slight tension on the concentrator film 4 to pull it over the tension wires 5 which gives the solar concentrator 2 its form.

The concentrator film 4 used may be Mylar, Kapton or Lucite. The reflective coatings thereon could be aluminum or silver. Each film has an advantage. Mylar's main advantage is its low-cost. Kapton has an advantage as it is resistant to atomic oxygen and therefore it has a longer life. Lucite film has the best optical properties. That is, it has a flatter surface. As for coatings, silver gives the best reflectivity. However, silver is subjected to tarnishing and therefore would lose its properties quite quickly. Film thickness could vary between 0.5 ml to 5 ml. The thinner materials probably have a greater advantage primarily because of weight and also because a larger amount fits on a roller.

Although this embodiment is shown with solar cells for receiving and utilizing concentrated sunlight other means such as heat pipes for collecting heat to run generators or for propulsion or other purposes may be employed at the focal point of the solar concentrator.

Obviously, many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. A concentrating solar array comprising:
   - a pair of extension arms, parallel to each other, the extension arms having a top end and a bottom end, the extension arms having pivots used to fold the extension arms before deployment of the concentrating solar array,
   - a plurality of pairs of wire stays attached to the bottom end of each extension arm and extending parallel to each other therefrom, each wire stay having a first end and a second end,
   - pivots on the first end and the second end of the wire stays, for folding the wire stays before deployment of the concentrating solar array, a plurality of tension wires connected between the parallel wire stays, for forming a concentrator, a reflective concentrator film, stretched over the tension wires along the length of the extension arms, for reflecting solar rays, a plurality of control lines connected between the top of the extension arms and the wire stays to control the position of the reflective concentrator film, a solar cell attached between the top ends of the extension arms for receiving solar rays reflected from the reflective concentrator film to generate electricity, a heat pipe attached to the solar cells, the heat pipe having radiating surfaces parallel to the length of the extension arms and above the top end of the extension arms to cool the solar cells, wherein the light reflected from the concentrator does not strike the heat pipes, and the heat is radiated away from the heat pipes such that it is not incident on the solar collector, a roller attached at the first end of the wire stays adjacent the extension arms, containing a length of reflective concentrator film for replacing degraded reflective concentrator film, and a take-up roller at the second end of the wire stays furthest from the extension arms, for taking up the spent reflective concentrator film, a motor attached to the take-up roller rotates the take up roller to keep a tension on the reflective concentrator film and to replace spent reflective concentrator film.

* * * * *